United States Patent
Konrad et al.

(10) Patent No.: US 7,649,489 B2
(45) Date of Patent: Jan. 19, 2010

(54) APPARATUS FOR ANALOG/DIGITAL CONVERSION OF A MEASUREMENT VOLTAGE

(75) Inventors: Stephan Konrad, Rieden (DE); Thomas Härle, Oy-Mittelberg (DE)

(73) Assignee: Endress + Hauser Wetzer GmbH + Co. KG, Nesselwang (DE)

( * ) Notice: Subject to any disclaimer, the term of this patent is extended or adjusted under 35 U.S.C. 154(b) by 42 days.

(21) Appl. No.: 11/579,588

(22) PCT Filed: May 4, 2005

(86) PCT No.: PCT/EP2005/052060

§ 371 (c)(1),
(2), (4) Date: Dec. 31, 2007

(87) PCT Pub. No.: WO2005/112268

PCT Pub. Date: Nov. 24, 2005

(65) Prior Publication Data

US 2008/0258956 A1 Oct. 23, 2008

(30) Foreign Application Priority Data

May 7, 2004 (DE) .................. 10 2004 023 145

(51) Int. Cl.
*H03M 1/50* (2006.01)
(52) U.S. Cl. .................. 341/166; 341/143; 341/155; 341/164
(58) Field of Classification Search .................. 341/143, 341/155, 164–166
See application file for complete search history.

(56) References Cited

U.S. PATENT DOCUMENTS

| 4,584,566 A | * | 4/1986 | Arcara .................. 341/128 |
| 4,598,270 A | * | 7/1986 | Shutt et al. .................. 341/166 |
| 4,999,632 A | | 3/1991 | Parks |
| 5,097,264 A | | 3/1992 | Brenner |
| 5,157,400 A | | 10/1992 | Bang |
| 5,184,128 A | | 2/1993 | Snow |
| 5,245,343 A | * | 9/1993 | Greenwood et al. ......... 341/143 |
| 5,519,361 A | | 5/1996 | Kim |

(Continued)

FOREIGN PATENT DOCUMENTS

DE 1390063 4/1975

(Continued)

*Primary Examiner*—Khai M Nguyen
(74) *Attorney, Agent, or Firm*—Bacon & Thomas, PLLC

(57) ABSTRACT

Apparatus for the analog/digital conversion of a measurement voltage with an analog/digital converter, which has an integrating component with an operational amplifier, a resistor and a capacitor in a feedback loop, wherein a reference voltage is applied to the inverting input of the operational amplifier and wherein the measurement voltage is applied to the non-inverting input of the operational amplifier The capacitor is charged during a charging phase of time length ($t_1$) and discharged during a discharging phase of time length, wherein the analog/digital converter further includes a comparator connected downstream from the operational amplifier, a memory element connected downstream from the comparator, a time generator producing the charging time and a counter, the counter detects the edges, or the period length of the pulse-width modulated output signal provided by the A/D converter on the output, and a synchronizing element is provided, which synchronizes the edges of the pulse-width modulated, output signal with the clock pulse of the counter at least within a predetermined measurement duration.

10 Claims, 3 Drawing Sheets

U.S. PATENT DOCUMENTS

| | | |
|---|---|---|
| 6,243,034 B1 | 6/2001 | Regier |
| 6,664,908 B2 * | 12/2003 | Sundquist et al. ........... 341/143 |
| 2003/0001654 A1 | 1/2003 | Yamamoto |
| 2003/0053587 A1 | 3/2003 | Demharter |

FOREIGN PATENT DOCUMENTS

| | | |
|---|---|---|
| DE | 40 37 268 A1 | 6/1991 |
| DE | 44 03 732 C1 | 10/1995 |
| DE | 100 40 373 B4 | 2/2001 |
| DE | 101 28 942 A1 | 1/2003 |
| JP | 02246622 A | 10/1990 |
| WO | WO 93/17502 | 9/1993 |

* cited by examiner

APPARATUS FOR ANALOG/DIGITAL CONVERSION OF A MEASUREMENT VOLTAGE

FIELD OF THE INVENTION

This application is a 371 of PCT/EP2005/052060 filed May 4, 2005 which claims priority to Germany application No. 10 2004 023 145.1 filed May 7, 2004.

The invention relates to an apparatus for analog/digital conversion of a measurement voltage.

BACKGROUND OF THE INVENTION

Representative of a method for A/D conversion, for the transforming of an analog input voltage into a digital number proportional to the amplitude, is the count method. Embodiments of the count method are the single-ramp method and the double-ramp method, wherein, by means of an integrating component, in the case of the first-mentioned method, only the input voltage is integrated, while, in the case of the second-mentioned method, both the input voltage and the reference voltage are integrated.

The period length for the A/D conversion of a measurement signal is determined by the sum of the discharging time $t_1$ and the charging time $t_2$ of a capacitor, which is arranged in the feedback loop of the integrating component. The switching between the charging phase and the discharging phase occurs, in each case, at that point in time, when the output voltage of the integrating component reaches a predetermined threshold voltage. This is implemented via a downstream comparator, whose one input receives the output voltage of the integrating component and whose other input receives the threshold voltage.

For measuring the period length of the pulse-width modulated output signal, the time between two rising, or two falling, edges of the pulse-width modulated, output signal is registered by means of a counter. The resolution in the determining of the period length is, in such case, dependent on the frequency of the counter clock signal—the higher the counter clock frequency, the better is the time resolution. If, for example, the counter is operated with the counter clock frequency f, then the following holds for the smallest measurable time change $\Delta t$:

$$\Delta t = 1/f.$$

Known A/D converters become naturally more expensive, as their resolution becomes higher. Moreover, the resolution of known A/D converters is usually fixedly predetermined, so that, usually, an A/D converter optimally adapted for the particular case of application is installed.

In process measurements technology, the tendency is in the direction of multiparameter measuring devices—thus measuring devices able to measure a plurality of different, physical or chemical, process variables. Examples of such process variables include e.g. temperature, pressure, fill level, flow, pH-value, ion concentration, conductivity, etc. of a medium to be measured. The quality of a measurement is determined, in principle, by the measurement accuracy and/or the time resolution of the measuring, thus the measurement rate. Usually, these two requirements work against one another. Thus, for a highly accurate measurement, a correspondingly long time is needed. In contrast, if the time for a measurement is limited, then the increased rate of measurement is at the cost of measurement accuracy. The escape route is represented by A/D converters, which are appropriately fast and which, at the same time, have a high bit-resolution. The disadvantage of these converters is that they are relative expensive, which, in turn, drives the manufacturing costs for the measuring devices significantly upwards.

Exactly in the case of multiparameter measuring devices, yet another aspect enters the picture: In process measurements technology, different requirements, as regards measurement accuracy and as regards time resolution, are placed on the providing of the measured value, i.e. on the A/D conversion of the measurement signals representing the individual process variables. In terms of an example, consider temperature, a process variable, which usually changes relatively slowly as a function of time, since, in the normal case, no abrupt temperature jumps arise. However, exactly in the case of temperature measurements, usually a high measurement accuracy is required. Mentioned in this connection is the monitoring and/or control of temperature in a chemical process. Since the temperature changes relatively slowly, relatively much time is available for registering the measured value.

Quite different is the situation e.g. in the case of a pressure measurement. In this case, it is necessary also to be able to detect suddenly occurring, pressure jumps. This is only possible, when the measurement duration is correspondingly short; in the case of many pressure measurements, however, the accuracy of measurement is of lower importance. It makes sense in this connection then to find a compromise, or a flexible solution, as the case may be, which permits an adapting of the registering of the measured value, as regards both measurement accuracy and measurement duration, to the particular requirements of a given application.

SUMMARY OF THE INVENTION

An object of the invention is to provide a cost-favorable apparatus for the A/D conversion of measurement signals, which is flexibly adaptable to the requirements of a given measurement task.

The object is achieved by an apparatus having the following structure: The analog/digital converter includes an integrating component having an operational amplifier, a resistance and a capacitance in a feedback loop. Applied to the inverting input of the operational amplifier is a reference voltage and to the non-inverting input of the operational amplifier the measurement voltage, or input voltage. During a charging phase of a predetermined length of time, the capacitor is charged, and during a discharging phase, the capacitor is discharged.

Additionally, the analog/digital converter includes a comparator downstream of the operational amplifier, a memory element downstream of the comparator, a time generator producing the charging time, and a counter, with the counter detecting the edges (or the period length) of the pulse-width modulated output signal provided at the output of the A/D converter. The memory element is, in a preferred embodiment, an SR flip-flop. Additionally, a synchronization element is provided, which, at least within a predetermined measurement duration, synchronizes the edges of the pulse-width modulated output signal with the clock pulse of the counter.

As already mentioned, the switching between the charging phase and the discharging phase occurs, without synchronization of the pulse-width modulated, output signal with the clock pulse of the counter, exactly upon the reaching of the set, or predetermined, threshold voltage, thus at that point in time at which the charge stored in the capacitor of the integrating component is again discharged. According to the invention, the edges of the pulse-width modulated, output signal are synchronized with the counter clock pulse via a synchronizing element. In this way, the switching between the discharge phase and the charging phase does not occur upon the reaching of the threshold voltage, but, instead, first upon the next clock pulse of the counter, thus at a voltage value, which lies above the threshold voltage. The integrating component is thus forced, despite the reaching of the threshold voltage, to keep integrating until the occurrence of the next counter clock pulse. In this way, a residual charge occurs in the capacitor of the integrating component. This procedure repeats at every subsequent conversion. The residual charges are summed, until, finally following a certain number of conversions, an abrupt change of the counter value occurs.

In a preferred embodiment of the apparatus of the invention, a clock signal generator is provided, which issues a system clock signal, and the synchronizing element, the counter, the analog/digital converter and the time generator are synchronized with the system clock signal. An advantage of this embodiment, wherein all clocking is derived from the same system clock signal, is that clock drifts, which can arise due to temperature changes, or over a long operating time, have no influence on the quality of the conversion.

An advantageous further development of the apparatus of the invention provides an analog switch, which switches the reference voltage, which is applied to the inverting input of the operational amplifier, between two different voltage values. This further development has the advantage, that the reference voltage applied to the inverting input of the operational amplifier is freely selectable, i.e. it can have any value. If a freely selectable reference voltage is not required, then the analog switch can be omitted. For example, the output voltage of the synchronizing element can be fed to the inverting input of the operational amplifier as reference voltage. If the synchronizing element is, as provided in an advantageous, further development of the invention, a D flip-flop, then, in this alternative solution, the operating voltage of the D flip-flop is that which is applied to the inverting input of the operational amplifier. Moreover, an advantageous embodiment of the apparatus of the invention provides that the counter has a capture-compare input. The counter is, in each case, switched-on during a predetermined measurement duration and detects the edges of the pulse-width modulated output signal. In principle, a correct manner of operation is, naturally, only then possible, when at least one period of the pulse-width modulated output signal lies within the selected measurement duration. At each detected edge of the pulse-width modulated output signal, an interrupt is produced. Additionally, a preferred embodiment of the apparatus of the invention includes a microprocessor, which determines the input voltage from the counter values produced by the interrupts, especially via an averaging of a plurality of counter values.

Viewed as especially advantageous in connection with the solution of the invention is the assigning of a memory unit to the microprocessor. In the memory unit, the number of interrupts produced during a predetermined measurement duration by the edges of the pulse-width modulated output signal is stored. The microprocessor calculates the input voltage following expiration of the predetermined measurement duration according to the following formula:

$$Ue = \frac{t_1 \cdot U_H}{Z - Z1} \cdot (I - 1)$$

wherein the variable $Z1$ corresponds to the first counter value, $Z$ represents the subsequent counter values, which are stored as overwrites in the memory unit, $I$ reflects the number of interrupts counted during the measurement duration, $t_1$ the charging time and $U_H$ the reference voltage applied to the integrating component. Considered to be an especially advantageous embodiment of the apparatus of the invention is that in which the microprocessor recognizes under- and over-voltages and generates corresponding error signals. An under-voltage is, for example, easily determinable on the basis of at least two edges of the pulse-width modulated, output voltage, or at least two interrupts, not being detected within the duration of a measurement. An over-voltage is recognizable by the fact that the processing time of the interrupts is longer than the period length to be measured. In order to avoid measurement errors, the number of occurring interrupts must, in such case, be upwardly bounded.

Alternatively, it is provided that the microprocessor so adapts the measurement duration, that the occurrence of under- and/or over-voltages is prevented.

BRIEF DESCRIPTION OF THE DRAWINGS

The invention will now be explained in greater detail on the basis of the appended drawings, the figures of which show as follows.

DESCRIPTION OF THE PREFERRED EMBODIMENTS

Figure 1:
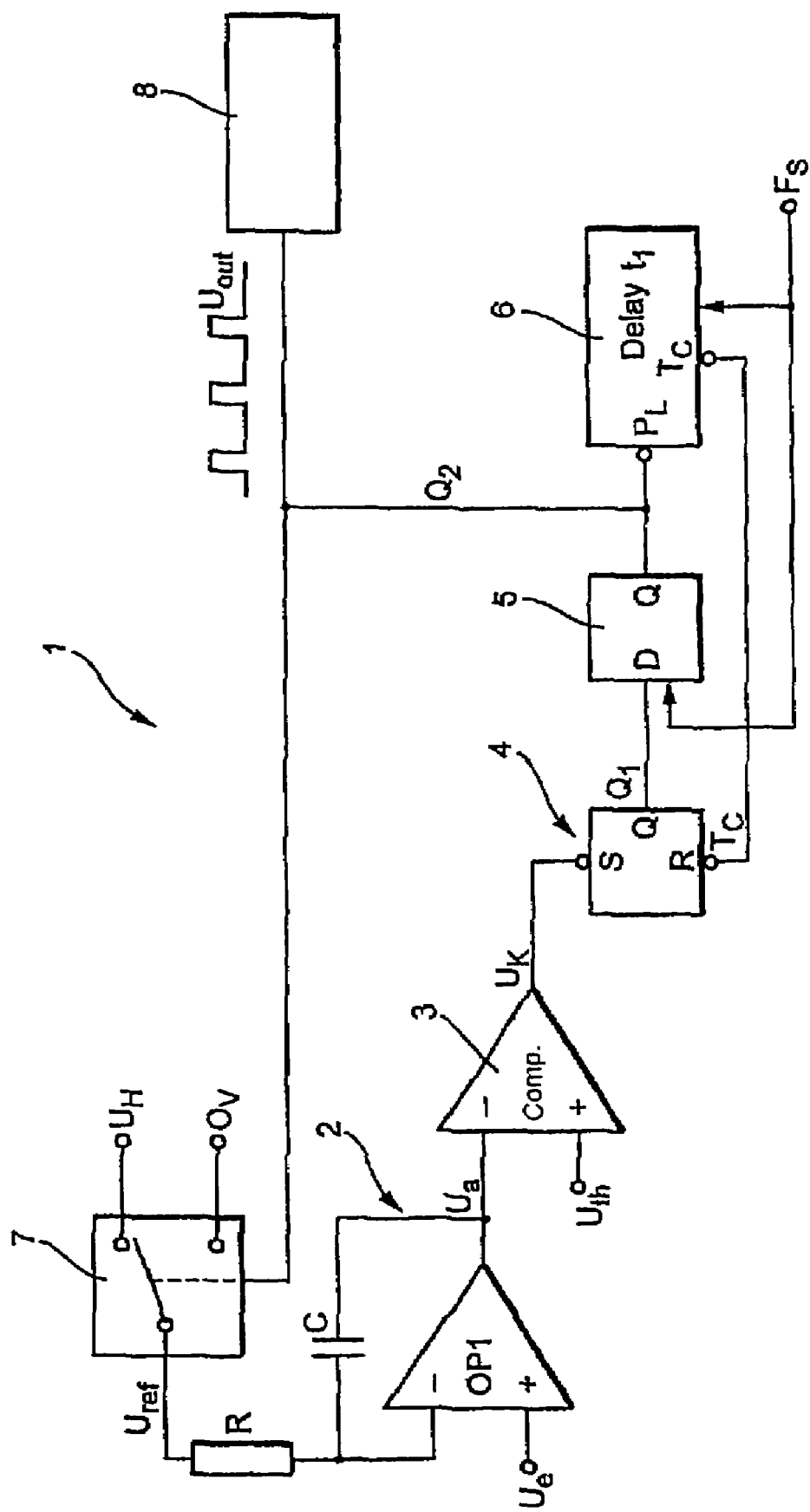
FIG. 1 a block circuit diagram of the A/D converter of the invention.

FIG. 1 shows a block, circuit diagram of the A/D converter 1 of the invention. Analog/digital converter 1 is composed of the following components:

- the integrating component 2, including operational amplifier OP1, resistance R and capacitance C in the feedback loop;
- comparator 3;
- memory element 4, here the SR flip-flop 4;
- synchronizing element 5, here the D flip-flop;
- time generator 6.

In a preferred variant of the invention shown in the drawing, the synchronizing element 5, the analog/digital converter 1, the counter 8 and the time generator 6 are synchronized with the system clock signal $T_s$. It is also possible, as already mentioned, to synchronize using the counter clock signal f, instead of the system clock signal $T_s$.

Optionally, an analog switch 7 is provided. It is possible to omit this, when a freely selectable, reference voltage $U_{ref}$ is not necessary. If it is not required, that the reference voltage $U_{ref}$ be freely selectable, then, e.g. directly, the output voltage $Q_2$ of the synchronizing element 5, or, during operation without synchronization, the output voltage $Q_1$ of the memory element 4 can be used as reference voltage $U_{ref}$. In these cases, thus, the operating voltage of the D flip-flop 5 or the SR flip-flop is, at the same time, the reference voltage $U_{ref}$, which is applied to the inverting input of the operational amplifier OP1.

The A/D converter 1 has three inputs and one output:
the input voltage $U_e$ is applied to the first input;
the reference voltage $U_H$ is applied to the second input; and
the system clock signal $T_s$ is applied to the third input.

Provided on the output of the A/D converter 1 is the pulse-width modulated, output signal $U_{out}$, which represents the digital conversion of the analog measurement signal $U_e$.

The operational amplifier OP1 acting as integrating component 2 is charged during a length of time $t_1$ provided by the time generator 6. Then, the length of time $t_2$ of the discharging phase is measured. The length of time $t_2$ corresponds to the time needed until, due to the discharging capacitor C, a certain output voltage $U_a$ is measured on the output of the integrating component 2. Usually this corresponds to the threshold voltage $U_{th}$; according to the invention, the switching occurs by the synchronization with the counter, but, at a voltage, which is above the predetermined threshold voltage. The timing of the voltages $U_a$, $U_K$, $Q_1$, $Q_2$ applied to the individual components, or the timing of the voltages $U_{ref}$, $T_C$, as the case may be, delivered by the individual components, is shown specially in FIG. 2.

Figure 2:
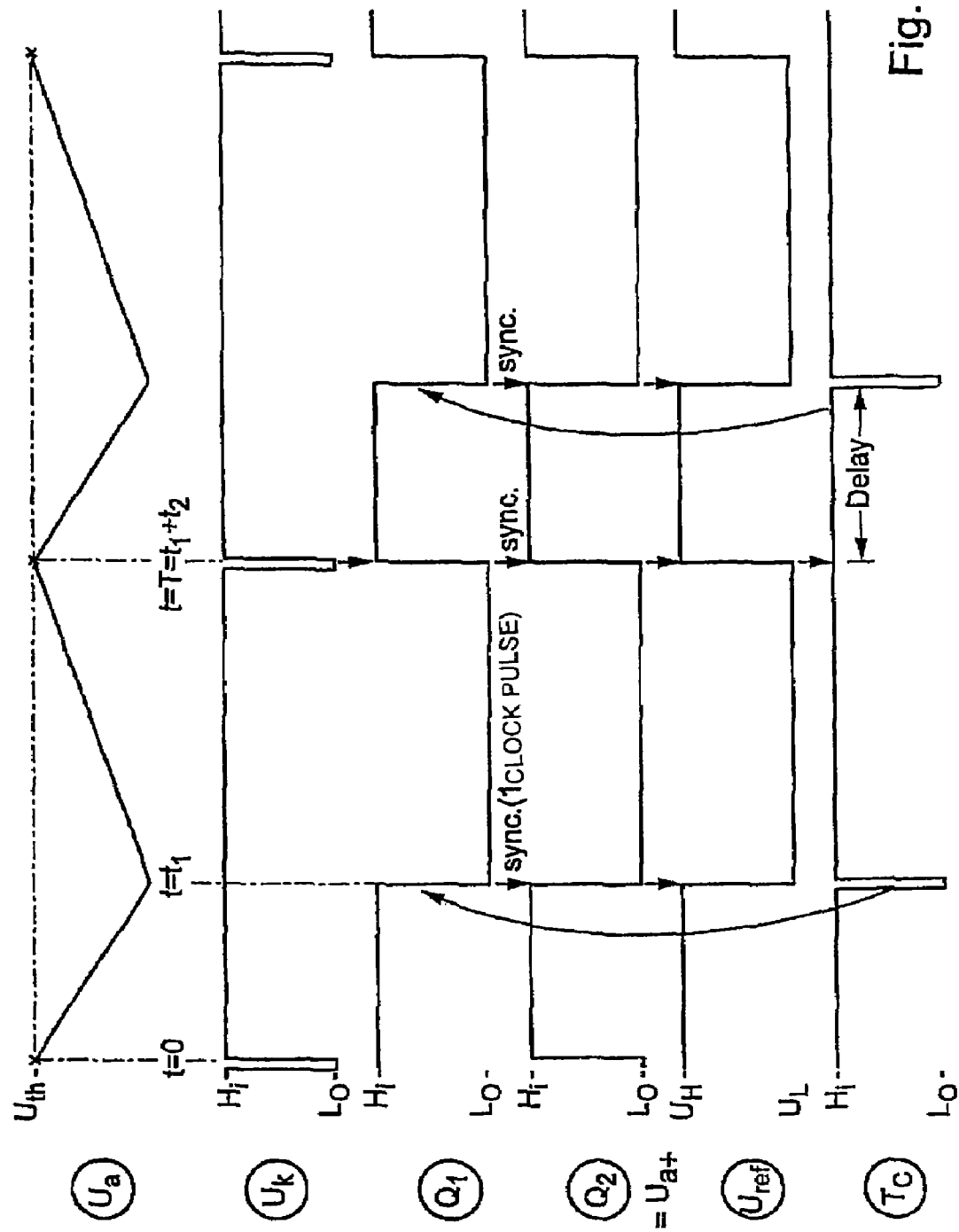
FIG. 2 a graphical presentation of the voltages on various components of the A/D converter of the invention shown in FIG. 1.

At the point in time t=0, the so-called charging phase begins. This is indicated in FIG. 2 with (1). At the point in time t=0, via the corresponding switch position of the analog switch 7, the voltage $U_H$ is present at the inverting input of the operational amplifier OP1. When the reference voltage $U_H$ is greater than the input voltage $U_e$, the voltage $U_a$ on the output of the operational amplifier OP1 falls linearly, starting from the threshold voltage $U_{th}$. The output $U_K$ of the comparator 3, the output $Q_1$ of the SR flip-flop 4, the output $Q_2$ of the D flip-flop 5 (which corresponds to the pulse-modulated output signal $U_{out}$), and the output $T_C$ of the time generator 6 are all at the binary level Hi during this time. At the point in time $t_1$, the output voltage $U_a$ lying on the output of the integrating component 2 can be expressed as follows:

$$Ua(t1) = Uth + \frac{1}{RC}(Ue - UH) \cdot t1 \tag{1}$$

Upon lapse of the length of time lying between the points in time t=0 and $t_1$, the time generator 6 produces on the output $T_C$ a short clock pulse at the binary level Lo. In this way, a reset signal is produced at the SR flip-flop 4; as a result of this, the output signal $Q_1$, and, one clock pulse later, the output signal $Q_2$ are set to the binary level Lo. Additionally, the analog switch 7 switches the reference voltage $U_{ref}$ to 0V, and the discharging phase begins, this being indicated in FIG. 2 with (2).

When the reference voltage 0V is smaller than the input voltage $U_e$, the output voltage $U_a$ increases linearly. At the point in time $T=t_1+t_2$, the voltage $U_a$ again reaches the threshold voltage $U_{th}$, and the comparator 3 switches. As a result, the output voltage $U_K$ of the comparator 3 is set to the binary level Lo; additionally, the SR flip-flop is set (→SET). $Q_1$ lies at the binary level Hi, and, one clock pulse later, the output voltage of the D flip-flop $Q_2$ lies at the binary level Hi. $Q_2$ serves for switching the reference voltage $U_{ref}$ and for release of the time generator 6. The charging phase (1) begins anew. At the point in time $T=t_1+t_2$, the output voltage $U_a$ can be mathematically expressed as follows:

$$Ua(T) = Uth = Ua(t1) + \frac{1}{RC}Ue \cdot t2 \tag{2}$$

By inserting $U_a(t_1)$ of formula (1) into formula (2), the following relationship between the input voltage $U_e$ and the length of the period T in the settled state of the A/D converter 1 results:

$$Ue = \frac{UH \cdot t1}{T} \tag{3}$$

If the reference voltage $U_H$ and the predetermined delay time $t_1$ (Delay $t_1$) are known and constant, then the following mathematical relationship results:

$$Ue = \frac{UH \cdot t1}{T} = \frac{a}{T} \sim \frac{1}{T} \tag{4}$$

The input voltage $U_e$ is, under these conditions, thus indirectly, or inversely, proportional to the length T of the period, where $T=t_1+t_2$.

In order to measure the length T of the period, the time between two rising edges or two falling edges of the pulse-width modulated, output signal $U_{out}$ is registered with the counter 8. The time resolution of the period length T depends, in such case, quite significantly on the frequency f of the counter clock signal of the counter 8. If the counter 8 is driven with the system clock signal $T_s$, then the following mathematical relationship holds for the smallest measurable time change $\Delta t$:

$$\Delta t = \frac{1}{Ts} \tag{5}$$

This usual resolution limit is removed in the case of the A/D converter 1 of the invention.

Without synchronization on the basis of the system clock signal $T_s$ or on the basis of the clock signal of the counter 8, the switching between the discharging phase (2) and the charging phase (1) occurs always exactly upon the reaching of the threshold voltage $U_{th}$, thus at a point in time, when the charge stored in the integrating component 2 during the charging phase (1) has again been discharged. According to the invention, the A/D converter 1 and the counter 8 are synchronized with the system clock signal $T_s$ or with the counter clock signal f of the counter 8.

By synchronizing the A/D converter 1, the counter 8 and the time generator with the system clock signal $T_s$, or with the counter clock signal f, the aforementioned switching occurs only at the next clock pulse of the system clock signal $T_s$, or of the counter clock signal f. The switching between the two phases occurs, thus, not at $U_{th}$, but, instead, above $U_{th}$. As a result of this, a residual charge occurs in the integrating component 2, which builds with every cycle and finally leads to a jump in the counter value. There arises a cycle of measured values with the resolution of the counter 8. An averaging over n measured values of this cycle increases the resolution by at least a factor of n. The higher the number of averaged, measured values, the better is, also, the resolution R. A doubling of the averaged measured values leads, at least, to a doubling of the resolution and thus to a doubling of the accuracy of measurement.

Figure 3:
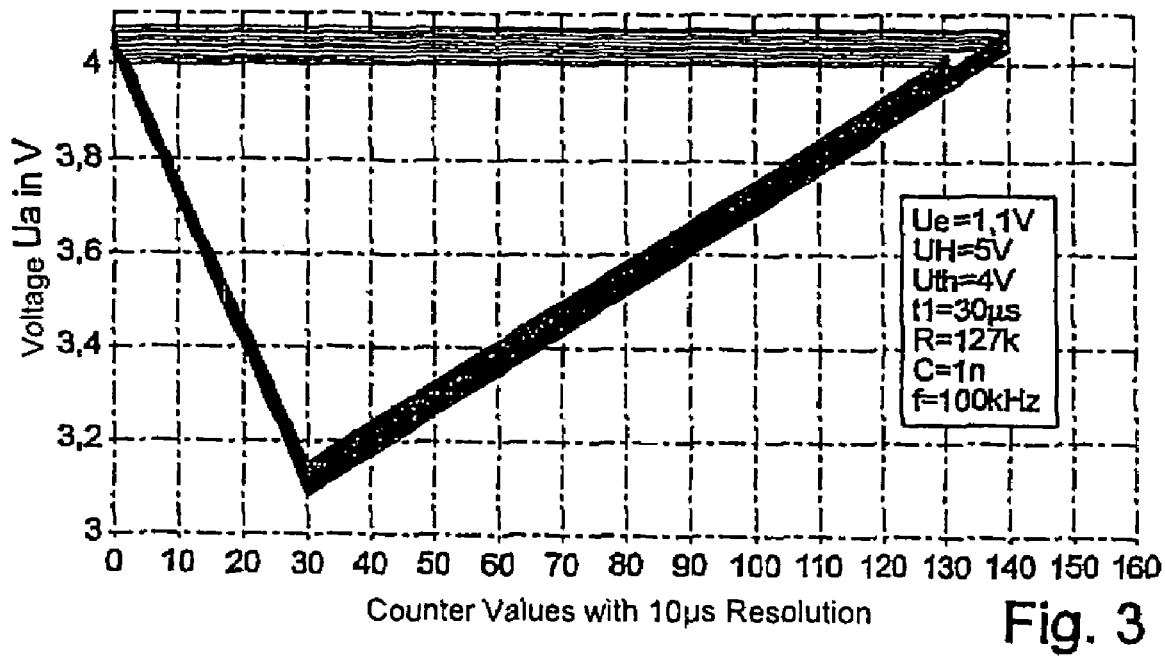
FIG. 3 a graphical presentation, in which the output voltage $U_a$ of the operational amplifier is plotted versus the counter values of the counter over the course of a measurement cycle.

FIG. 3 shows, by way of example, the voltage $U_e$ as a function of the counter values of the counter 8 for one cycle. This shows, how the output voltage $U_a$ of the integrating component 2 changes as a function of time over one cycle, in which a multiplicity of charging and discharging phases are passed through. At a clock frequency of 10 kHz, the counter values have a resolution of 10 μsec. During the cycle, counter 8 produces the counter value 130 μsec four times and the counter value 140 μsec seven times. In microprocessor 10, the average value is formed from the eleven measured values, so that one obtains the exact value 136.3636 μsec, even though the actual resolution of the counter amounts to only 10 μsec.

Figure 4:
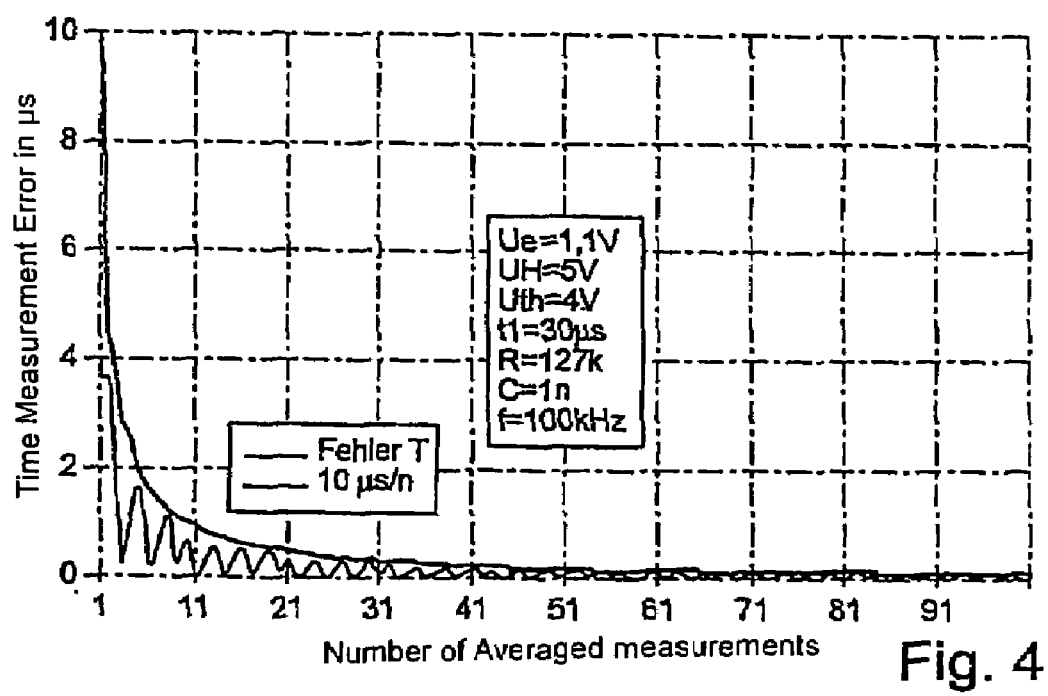
FIG. 4 a graphical presentation, in which the error of the time measurement is plotted versus the number of measured values being averaged.

By way of example, FIG. 4 represents the gain in resolution achieved by the apparatus of the invention through the averaging. In particular, this graph shows the error in the time measurement plotted against the number n of measurements performed in one cycle. With reference to the example shown in FIG. 3, the error at an averaging above n=11 approaches zero. Guaranteed, however, is only the envelope curve 1/n. Theoretically, the present invention permits a resolution of any size, provided that the measurement window, or length of time used for the measurement, is correspondingly increased. The increased accuracy of measurement does, it is true, come with sacrifice in measurement speed, but, depending on the type of application, or type of measurement, this is of only lesser importance. Practically, limits are set for the resolution due to the appearance of noise and non-linearities.

Because of the non-linear relationship shown in Formula (3) between the input voltage $U_e$ and the period length T, the resolution of the measured voltage is not linear. Large input voltages $U_e$ result in small period lengths T and are less resolved. According to the invention, the following algorithm is preferably used for the evaluation:

A counter with capture-compare input is switched-on for a measurement duration X (e.g. X=4 ms). The counter levels at the interrupts I produced by the edges of the pulse-width modulated signal $U_{out}$ are saved as follows in the memory unit 11. The first counter value is stored in the variable Z1; the following is saved in an overwriting manner in the variable Z. The number of interrupts is kept in a variable I. Following expiration of the measurement duration X, the voltage $U_e$ can then be calculated as follows:

$$Ue = \frac{a}{Z - Z1} \cdot (I - 1) \quad (6)$$

A small input voltage $U_e$, which produced a period length T somewhat smaller than X is, thus, not averaged and is measured with the resolution of the counter 8. A large input voltage $U_e$, which produces a very small period length T, is measured very often and averaged, with the resolution being improved by the above-described method. A signal with a period length T=X/2 has, therefore, the smallest resolution. The resolution R of the A/D converter 1 thus can be described by the following formula:

$$R = \frac{X}{2} \cdot Ts \quad (7)$$

If the measurement duration amounts, for example, to X=4 ms and the system clock signal $T_s$=8 MHz, then the resolution R of the A/D converter 1 is 16,000, or 14 bits.

In the software of the microprocessor 10, the following errors are intercepted:

An undervoltage is recognized, when no two edges of the pulse-width modulated, output signal, or no two interrupts, occur during the measurement duration X. This is an indicator for the fact that the measurement voltage, or the input voltage, $U_e$ is too small.

An overvoltage is recognizable by the fact that the processing time TI of the interrupts is longer than the period length T, and measurement errors result. Therefore, it is necessary to limit the maximum number of interrupts to X/TI.

Advantages of the apparatus of the invention are reviewed as follows:

The following errors do not, in principle, enter the measurement:

If the time generator is synchronized with the counter clock signal f, then drift of the charging time $t_1$ (e.g. due to temperature changes or arising over operating life) does not influence the measurement result;

if all clock pulses of the circuit components 6, 8, 1 are derived from the same clock signal $T_s$, then drift of the clock signal $T_s$ (for instance due to temperature changes or via length of operation) play no role;

likewise fluctuations in the threshold voltage $U_{th}$ and at the RC element do not effect the measurement result negatively;

moreover, switching times of the digital circuit, which affect the length of time $t_2$ of the discharging phase, have no effect on the measurement result.

Moreover, the two-point calibration eliminates the following errors:

All analog offset variables at the operational amplifier OP1 (since, in this case, only a drift can produce a measurement error);

the value of the on-resistances of the analog switch 7;

the switching times, which affect the time length $t_1$ of the charging phase;

the absolute error of the reference voltage $U_H$ (also here, only a drift can produce a measurement error).

The invention claimed is:

1. An apparatus for analog/digital conversion of a measurement voltage, including:

an analog/digital converter, said analog/digital converter having: an integrating component with an operational amplifier, a resistor and a capacitor in a feedback loop, a clock signal generator which issues a system clock signal, wherein a reference voltage is applied to said inverting input of said operational amplifier and wherein the measurement voltage is applied to said non-inverting input of said operational amplifier, and wherein the capacitor is charged during a charging phase with a charging time and discharged during a discharging phase with a discharging time;

a comparator downstream of said operational amplifier;

a memory element downstream of said comparator;

a time generator producing the charging time;

a counter; and;

a synchronizing element, wherein:

at the inverting input of said comparator lies the output voltage of said integrating component and at the non-inverting input of said comparator lies the threshold voltage;

said analog/digital converter at its output provides a pulse-width modulated output signal with period duration;

said counter detects said period duration, of said pulse-width modulated, output signal;

said reference voltage and said discharge time are constant, so that said input voltage is in reverse proportion to said period duration;

said synchronizing element, which, at least within a predetermined measurement duration, synchronizes with a number of charging and discharging phases of said pulse-width modulated output signal with the cycle of said counter;

switchover takes place through the synchronization with said counter at an output voltage which is above said threshold voltage;

within the specified measurement duration a cycle of n measurement values occurs with the resolution of said counter; and said synchronizing element, said counter, said analog/digital converter and said time generator are synchronized with said system clock signal.

2. The apparatus as claimed in claim 1, further including:
an analog switch, which switches said reference voltage, which is applied to said inverting input of said operational amplifier, between two different voltage values.

3. The apparatus as claimed in claim 1, wherein:
a voltage on the output of said synchronizing element is supplied to said inverting input of said operational amplifier as said reference voltage.

4. The apparatus as claimed in claim 1, wherein:
a voltage on the output of said memory element is supplied to said inverting input of said operational amplifier as reference voltage.

5. The apparatus as claimed in claim 1, wherein:
said memory element comprises an SR flip-flop.

6. The apparatus as claimed in claim 1, wherein:
said synchronization element comprises a D flip-flop.

7. The apparatus as claimed in claim 1, further including:
a microprocessor, wherein:

said counter has a capture-compare input and, said counter being in each case, switched-on during a predetermined measurement duration and detects the edges of the pulse-width modulated output signal, and said microprocessor determines said input voltage from the counter values, especially via an averaging of a plurality of counter values.

8. The apparatus as claimed in claim 7, wherein:
said microprocessor has a memory unit;

the number of interrupts produced by the edges of said pulse-width modulated output signal is stored in said memory unit; and said microprocessor calculates said input voltage upon expiration of the measurement duration according to the following formula:

$$Ue=[a/(z-z1)]*(I-)$$

wherein:

the variable Z1 corresponds to the first value of said counter, Z represents the subsequent counter values, which are stored in said memory unit by overwriting, the variable I reflects the number of interrupts counted during the duration of the measurement, and a is a constant.

9. The apparatus as claimed in claim 7, wherein:
said microprocessor recognizes under-, and over-, voltages and generates an error signal.

10. The apparatus as claimed in claim 9, wherein:
said microprocessor so adapts said measurement duration, that the occurrence of under-, and/or over-, voltages is avoided.

* * * * *